United States Patent [19]
Wen

[11] Patent Number: 5,834,819
[45] Date of Patent: Nov. 10, 1998

[54] SEMICONDUCTOR READ-ONLY MEMORY DEVICE FOR PERMANENT STORAGE OF MULTI-LEVEL CODED DATA

[75] Inventor: Jemmy Wen, Hsinchu City, Taiwan

[73] Assignee: United Microelectronics Corp., Hsinchu City, Taiwan

[21] Appl. No.: 18,039

[22] Filed: Feb. 3, 1998

Related U.S. Application Data

[62] Division of Ser. No. 837,723, Apr. 22, 1997.

[30] Foreign Application Priority Data

Feb. 5, 1997 [TW] Taiwan ................................. 86101463

[51] Int. Cl.⁶ .............................................. H01L 21/8246
[52] U.S. Cl. .......................................... 257/390; 257/391
[58] Field of Search ...................................... 257/390–391

[56] References Cited

U.S. PATENT DOCUMENTS 5,264,386  11/1993  Yang .
5,330,924   7/1994  Huang et al. .
5,576,573  11/1996  Su et al. ................................. 257/391

Primary Examiner—Jey Tsai
Attorney, Agent, or Firm—Finnegan, Henderson, Farabow, Garrett & Dunner, L.L.P.

[57] ABSTRACT

A semiconductor read-only memory (ROM) device for permanent storage of multi-level coded data and a method of fabricating the same are provided. The ROM device is specifically devised for permanent storage of multi-level coded data that are represented by more than two logic states. The ROM device includes a semiconductor substrate formed an array of spaced major gate structures above the channel regions, and a plurality of minor gate structures formed between the major gate structures above the channel regions. Each of the major gate structures and one neighboring minor gate structure are in combination associated with one memory cell of the ROM device. The word lines are connected to the memory cells in such a manner that for those memory cells that are set to a first logic state, the word lines are connected to the associated major structures only; for those that are set to a second logic state, the word lines are connected to the associated minor structures only; for those that are set to a third logic state, the word lines are connected to both of the associated major and minor structures; and for those that are set to a fourth logic state, the word lines are isolated from the associated major and minor structures. The method requires only one pass of the mask-programming process to complete the coding of the data into the ROM device.

1 Claim, 8 Drawing Sheets

SEMICONDUCTOR READ-ONLY MEMORY DEVICE FOR PERMANENT STORAGE OF MULTI-LEVEL CODED DATA

This is a division of application Ser. No. 08/837,723, filed Apr. 22, 1997.

BACKGROUND OF THE INVENTION

1. Field of the Invention

This invention relates to semiconductor memory devices, and more particularly, to a semiconductor read-only memory (ROM) device which can be used for permanent storage of multi-level coded data, such as quaternary-coded data, and a method for fabricating the same.

2. Description of Related Art

Read-only memory (ROM) is a nonvolatile semiconductor memory widely used in computer and microprocessor systems for permanently storing information including programs and data that are repeatedly used, such as the BIOS (abbreviation for Basic Input/Output System, which is a widely used operating system on personal computers) or the like. The manufacture of ROMs involves very complicated and time-consuming processes and requires costly equipment and material to achieve. Therefore, the data to be permanently stored in ROMs is usually first defined by the customer and then furnished to the factory to be programmed into the ROMs.

Most ROMs are identical in semiconductor structure except for the different data stored therein. Therefore, the ROM devices can be fabricated up to the stage that is ready for data programming and then the semi-finished products are stocked in inventory awaiting customer orders. The customer then furnishes the data to the factory where the data are stored in the semi-finished ROMs by using the so-called mask-programming process. This procedure is presently a standard method in the semiconductor industry for fabricating ROMs.

Conventional ROMs are usually based on metal-oxide semiconductor field-effect transistor (MOSFET) memory cells, each of which serves to store one value of the binary-coded data. In the mask-programming process, the MOSFET-based memory cells are selectively doped with impurities into the associated channel regions so as to vary the threshold voltage thereof, which can set a first selected group of the memory cells to a permanently-ON state representing the permanent storage of a first binary digit, for example 0 while setting others to a permanently-OFF state representing the permanent storage of a second binary digit, for example 1.

FIG. 1 shows a schematic top view of a conventional MOSFET-based ROM device which is specifically designed for permanent storage of binary-coded data therein. This ROM device includes a plurality of memory cells as exemplarily indicated by the dashed boxes labeled with the reference numerals 100, 101, and 102, which can be accessed via a plurality of intercrossed word lines WL and bit lines BL. Each of the memory cells is associated with one segment of the word line between each neighboring pair of the bit lines under which one channel region, as exemplarily indicated by the reference numeral 10, is formed. Whether the memory cell 100 stores the binary data 0 or 1 is dependent on whether its associated channel region 10 is doped with impurities or not.

The foregoing type of ROM device is specifically devised for permanent storage of binary-coded data which have two different values only. To allow for a larger capacity of data storage, the logic data can be represented by more than two values. For example, the tertiary system handles the logic data by representing them in three different values, and the quaternary system handles the logic data by representing them in four different values. In general, such a system is referred to as an M-ary system for handling multi-level coded data represented by M different values (M>2). For permanent storage of the multi-level coded data, the memory cells of ROM device should be set to M different threshold voltage levels to represent the M different values of the multi-level coded data. In fabricating such a ROM device, the so-called multiple-code implantation process is used to form the memory cells with various threshold voltage levels representing the permanent storage of different values of the multi-level coded data.

For instance, as shown in FIG. 2, in a ROM device for permanent storage of multi-level coded data, the channel regions of the MOSFET-based memory cells are doped in a different manner so as to provide a first threshold voltage $V_T$ representing the permanent storage of a first value of the multi-level coded data, a second threshold voltage $V_{T1}$ representing the permanent storage of a second value of the multi-level coded data, a third threshold voltage $V_{T2}$ representing the permanent storage of a third value of the multi-level coded data.

One major drawback to the foregoing ROM device, however, is that the mask-programming process for the multiple-code implantation should be performed repeatedly for several passes. The mask-programming process is thus very time-consuming to carry out. The delivery period of the product of the ROM device is thus long, which makes the ROM device less competitive in the market.

SUMMARY OF THE INVENTION

It is therefore a primary objective of the present invention to provide a method for fabricating a semiconductor ROM device for permanent storage of multi-level coded data, in which only one mask-programming process is needed.

In accordance with the foregoing and other objectives of the present invention, a new method for fabricating a semiconductor ROM device is provided.

The semiconductor structure of the ROM device includes:

a semiconductor substrate;

a plurality of substantially parallel-spaced bit lines formed in said substrate;

a plurality of channel regions formed between said bit lines in said substrate;

an array of spaced major gate structures formed above said channel regions;

a plurality of minor gate structures formed between said major gate structures above said channel regions, each of said major gate structures and one neighboring minor gate structures being associated with one memory cell of the ROM device;

a plurality of sidewall spacers for separating said major gate structures from said minor gate structures; and a plurality of word lines connected to the memory cells of the ROM device.

The word lines are connected to the memory cells in the following manner:

(a) for a first selected group of the memory cells that are set to a first logic state, the associated word lines are electrically connected to the major gate structures while isolating the minor structures associated with the first selected group of the memory cells;

(b) for a second selected group of the memory cells that are set to a second logic state, the associated word lines are electrically connected to the minor structures while isolating the major gate structure associated with the second selected group of the memory cells;

(c) for a third selected group of the memory cells that are set to a third logic state, the associated word lines are electrically connected to both of the major and minor structures associated with the third selected group of the memory cells; and (d) for a fourth selected group of the memory cells that are set to a fourth logic state, the associated word lines are isolated from the major and minor structures associated with the fourth selected group of the memory cells.

Broadly speaking, the method in accordance with the invention for fabricating the foregoing ROM device includes the following steps of:

(1) preparing a semiconductor substrate;

(2) forming a plurality of polysilicon layers serving as a plurality of major gate structures on the substrate; then forming a plurality of sidewall spacers respectively on the sidewalls of the plurality of major gate structures;

(3) forming a plurality of polysilicon layers respectively between each neighboring pair of the major gate structures to serve as a plurality of minor gate structures;

the plurality of major gate structures and the minor gate structures therebetween in combination being associated with a plurality of memory cells for the ROM device, with each memory including one major gate structure and one neighboring minor gate structure;

(4) forming a dielectric layer over the memory cells;

(5) from the memory cells of the ROM device, locating a first selected group of the memory cells that are to be set to a first logic state, a second selected group of the memory cells that are to be set to a second logic state, a third selected group of the memory cells that are to be set to a third logic state, and a fourth selected group of the memory cells that are to be set to a fourth logic state; then performing a mask-programming process so as to form a plurality of contact windows in the dielectric layer in such a manner that the contact windows expose all of the major gate structures that are associated with the first selected group of the memory cells, all of the minor gate structures that are associated with the second selected group of the memory cells, and all of the sidewall spaces and part of the abutting major and minor gate structures that are associated with the third group of memory cells, with all of the major and minor gate structures that are associated with the fourth selected group of the memory cells being isolated by the dielectric layer;

(6) forming a conductive layer over the dielectric layer, the conductive layer filling up all of the contact windows; and (7) removing selected portions of the conductive layer so as to form a plurality of substantially parallel-spaced word lines.

More specifically, the method in accordance with the invention for fabricating the foregoing ROM device includes the following steps of:

(1) preparing a semiconductor substrate;

(2) forming a gate oxide layer over the substrate, and then forming a first polysilicon layer over the gate oxide layer;

(3) removing selected portions of the first polysilicon layer to expose selected surface areas of the gate oxide layer;

(4) performing an ion-implantation process through the exposed areas of the gate oxide layer so as to form a plurality of source/drain regions in the substrate, the source/drain regions serving as a plurality of bit lines for the ROM device;

(5) removing selected portions of the remaining portions of the first polysilicon layer so as to form an array of major gate structures on the substrate;

(6) forming a plurality of sidewall spacers respectively on the sidewalls of the plurality of major gate structures;

(7) forming a plurality of second polysilicon layers respectively between each neighboring pair of the major gate structures to serve as a plurality of minor gate structures;

the plurality of major gate structures and the minor gate structure therebetween in combination being associated with a plurality of memory cells for the ROM device, with each memory cell including one major gate structure and one neighboring minor gate structure;

(8) forming a dielectric layer over the memory cells;

(9) from the memory cells of the ROM device, locating a first selected group of the memory cells that are to be set to a first logic state, a second selected group of the memory cells that are to be set to a second logic state, a third selected group of the memory cells that are to be set to a third logic state, and a fourth selected group of the memory cells that are to be set to a fourth logic state; then performing a mask-programming process so as to form a plurality of contact windows in the dielectric layer in such a manner that the contact windows expose all of the major gate structures that are associated with the first selected group of the memory cells, all of the minor gate structures that are associated with the second selected group of the memory cells, and all of the sidewall spaces and part of the abutting major and minor gate structures that are associated with the third group of memory cells, with all of the major and minor gate structures that are associated with the fourth selected group of the memory cells being isolated by the dielectric layer;

(10) forming a conductive layer over the dielectric layer, the conductive layer filling up all of the contact windows in the dielectric layer; and

(11) removing selected portions of the conductive layer so as to form a plurality of substantially parallel-spaced word lines.

In conclusion, the four types of memory cells in the ROM device are provided with different threshold voltages due to the provision of different gate widths in accordance with the method of the invention. This allows the ROM device to store multi-level logic states while requiring only one pass of the mask-programming process. Compared to the prior art which require a number of ion-implantation processes for the mask programming, the advantage provided by the invention is apparent.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENT

FIGS. 3A through 3H are schematic sectional diagrams used to depict the steps involved in the method of the invention for fabricating a ROM device for permanent storage of multi-level coded data, such as quaternary-coded data with four different values of data.

Figure 1:
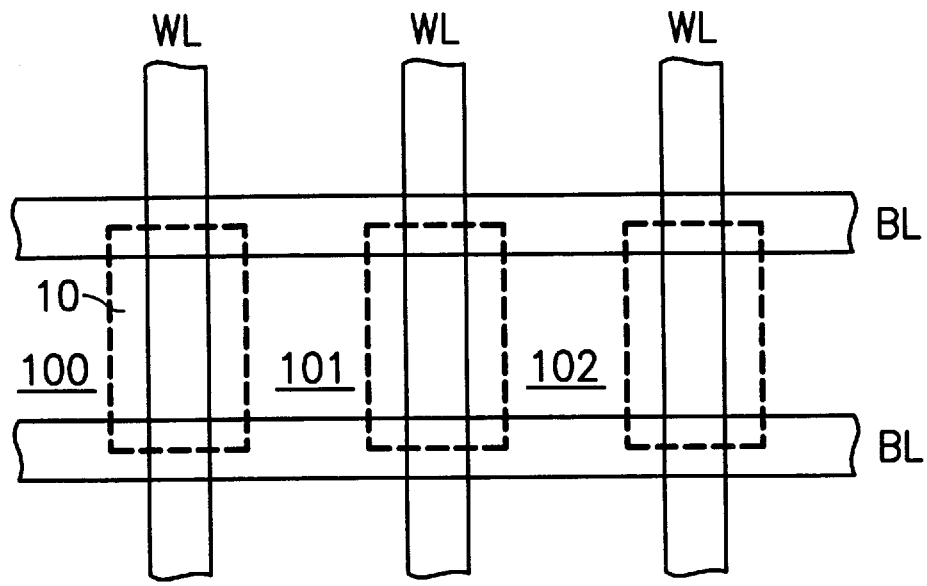
FIG. 1 is a schematic top view of a conventional ROM device for permanent storage of binary-coded data.
Figure 2:
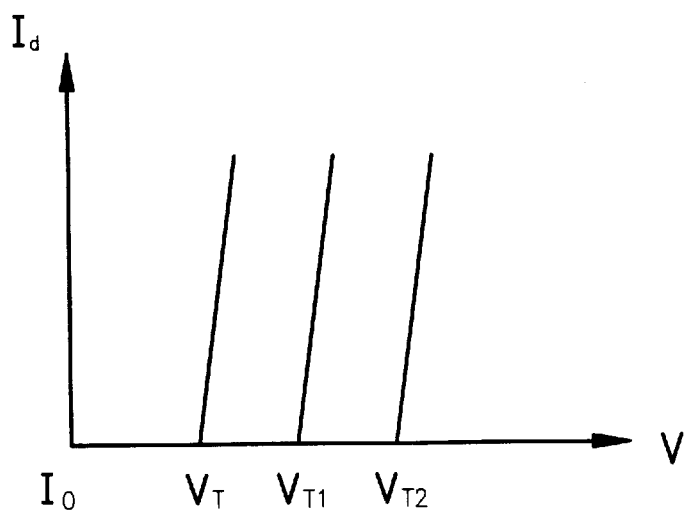
FIG. 2 is a graph showing the drain current ($I_d$) versus threshold voltage ($V_{WL}$) characteristic of the memory cells of a conventional ROM device for permanent storage of multi-level coded data.
Figure 3A:
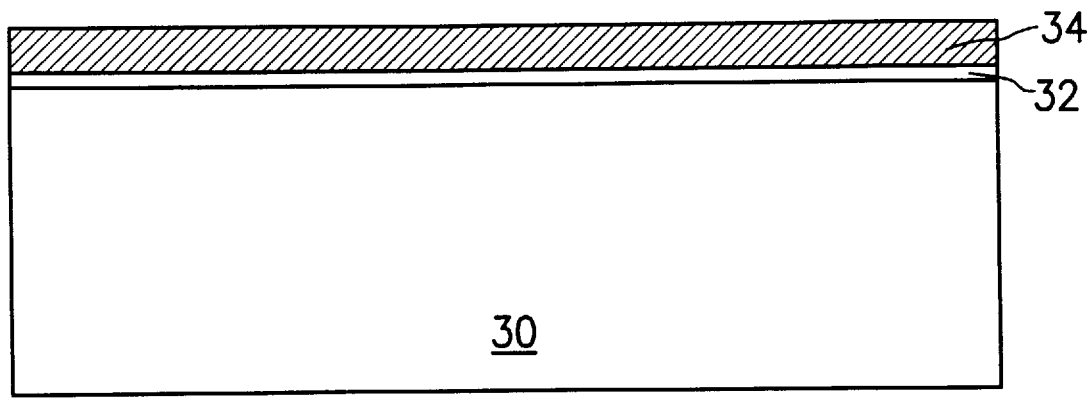
FIGS. 3A through 3H are schematic sectional diagrams used to depict the steps involved in the method of the invention for fabricating a ROM device for permanent storage of multi-level coded data.

Referring first to FIG. 3A, in the first step, a semiconductor substrate 30, such as a P-type silicon substrate, is prepared. Subsequently, a gate oxide layer 32 is formed over the substrate 30, and then a first polysilicon layer 34 is formed over the gate oxide layer 32.

Figure 3B:
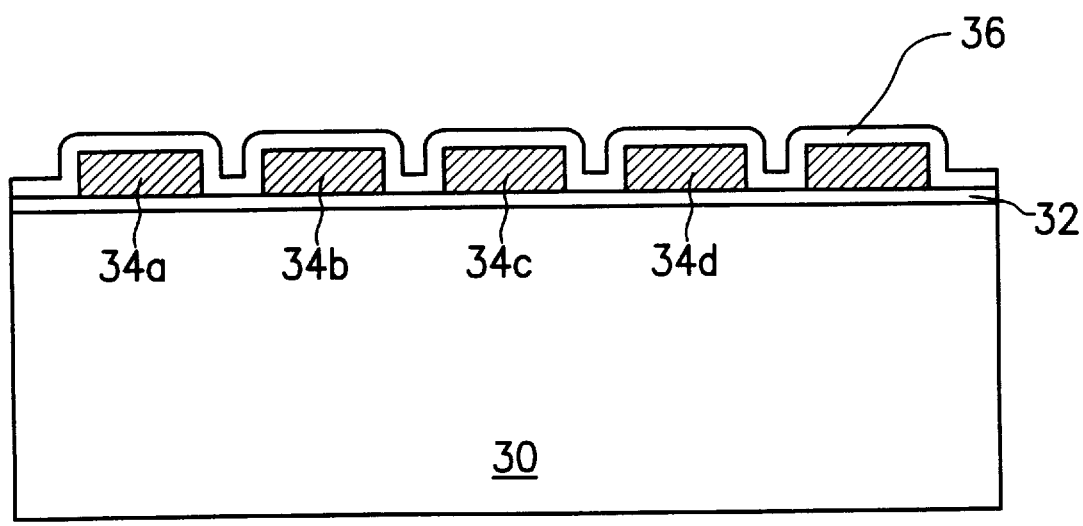

Referring next to FIG. 3B, in the subsequent step, the first polysilicon layer 34 is selectively removed so as to expose those surface areas of the gate oxide layer 32 under which a plurality of bit lines are to be formed in the substrate 30. Next, an ion-implantation process is performed on the wafer so as to dope an impurity material, such as arsenic (As), through the exposed areas of the gate oxide layer 32 into the substrate 30 to form a plurality of parallel-spaced source/drain regions (i.e., the $N^+$ regions illustrated in FIG. 4) in the substrate 30.

Subsequently, a photolithographic and etching process is performed on the remaining portions of the first polysilicon layer 34 so as to form a plurality of major gate structures including a first major gate structure 34a, a second major gate structure 34b, a third major gate structure 34c, and a fourth major gate structure 34d. After this, an insulating layer 36, such as an oxide layer, is formed by chemical-vapor deposition (CVD) over the entire top surface of the wafer, covering all of the exposed surfaces of the major gate structures 34a, 34b, 34c, 34d and the gate oxide layer 32.

Figure 3C:
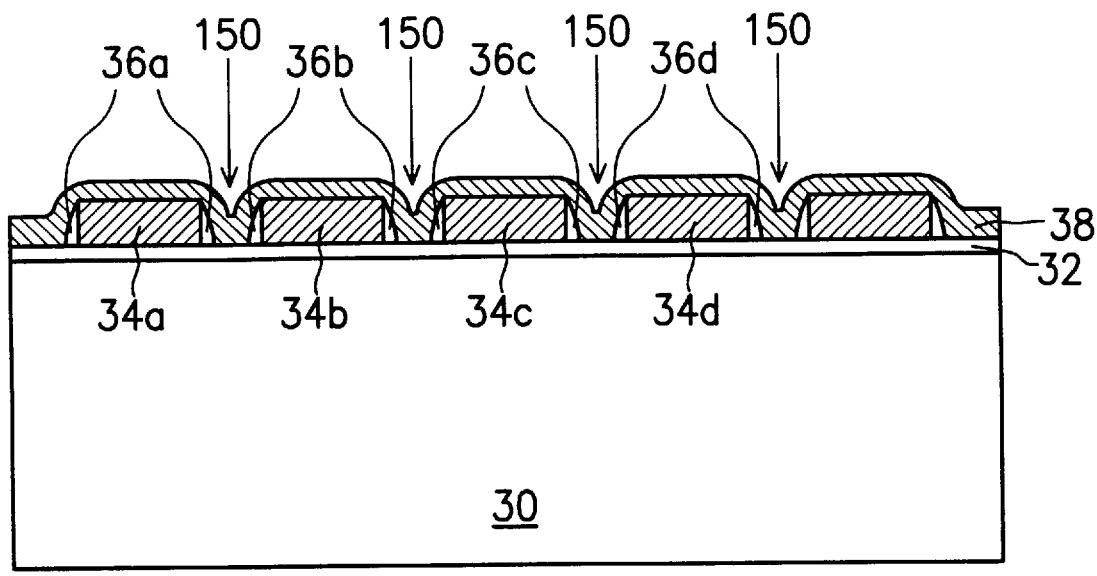

Referring further to FIG. 3C, an etch-back process is performed on the insulating layer 36 until only the sidewalls of the major gate structures 34a, 34b, 34c, 34d are layered with the remaining portions of the insulating layer 36. The remaining portions of the insulating layer 36 thus serve as a plurality of sidewall spacers 36a, 36b, 36c, 36d on the sidewalls of the major gate structures 34a, 34b, 34c, 34d. Subsequently, a second polysilicon layer 38 is deposited, for example by the CVD process, over the entire top surface of the wafer. Due to the empty spaces between the major gate structures 34a, 34b, 34c, 34d, the second polysilicon layer 38 is formed with a plurality of recesses 150 in the top surface thereof.

Figure 3D:
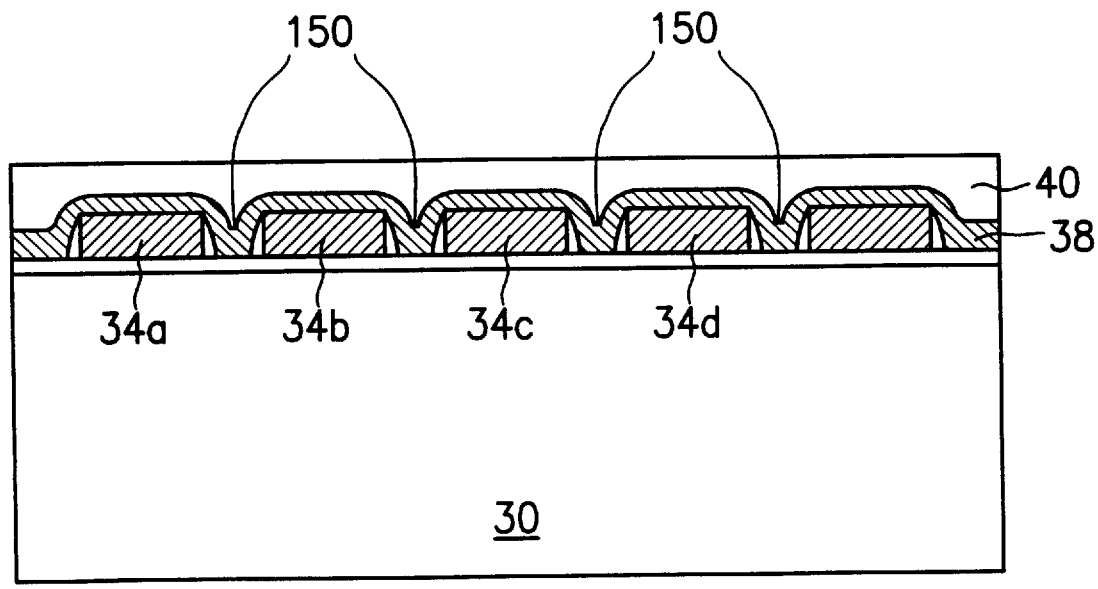

Referring next to FIG. 3D, an insulating layer 40 is formed by a planarization process over the entire top surface of the wafer. The planarization process can be, for example, a spin-on glass (SOG) process in which a liquid glass is coated over the wafer with a flat top surface.

Figure 3E:
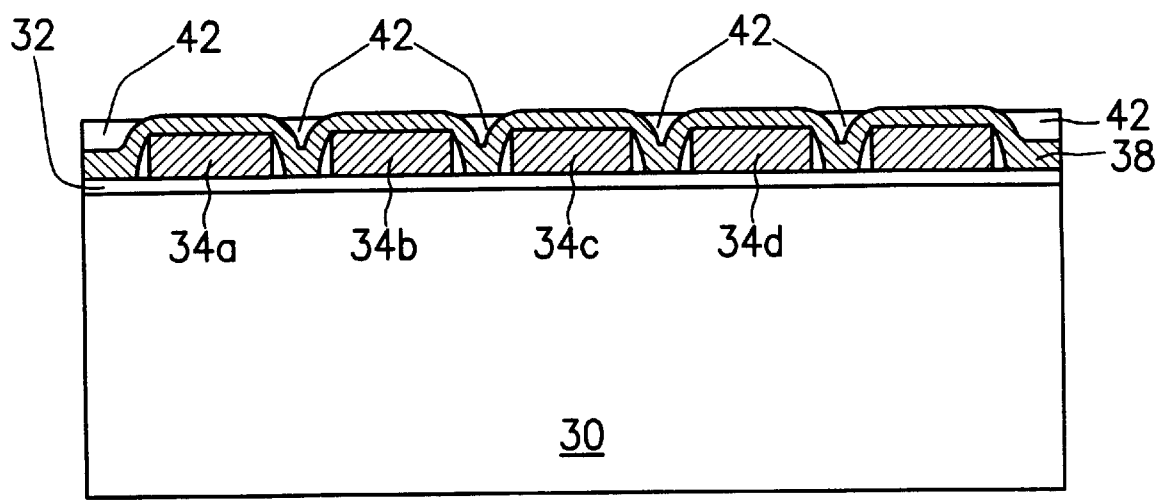

Referring further to FIG. 3E, the planarized insulating layer 40 is etched back or subjected to a chemical-mechanical polish (CMP) process. This gradually removes an upper portion of the insulating layer 40 until the top surfaces of those portions of the second polysilicon layer 38 that are layered above the major gate structures 34a, 34b, 34c, 34d are exposed, with the remaining portions of the insulating layer 40 (which are here designated instead by the new reference numeral 42) fill up the recesses 150 (FIG. 3D) in the top surface of the second polysilicon layer 38.

Figure 3F:
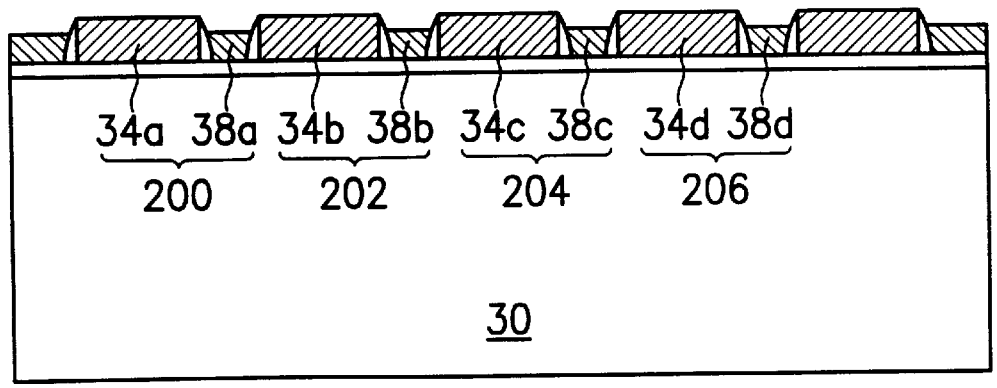
Figure 4:
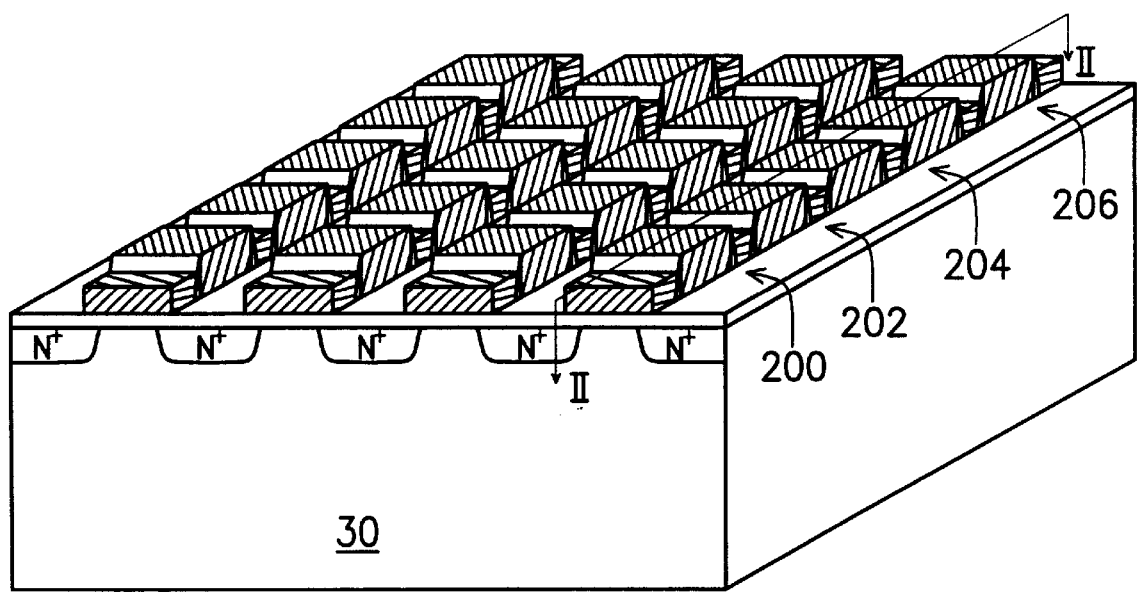
FIG. 4 is a schematic perspective view of the wafer structure of FIG. 3F.

Referring next to FIG. 3F together with FIG. 4 (FIG. 3F is a sectional view of the perspective view of FIG. 4 cutting through the line II—II), in the subsequent step, the insulating layers 42 and the sidewall spacers 36a, 36b, 36c, 36d are used together as an etch end point to conduct an etch-back process on the second polysilicon layer 38. Through this process, the remaining portions of the second polysilicon layer 38 (designated here by the reference numerals 38a, 38b, 38c, 38d in FIG. 3F) thus have a height lower than the neighboring major gate structures 34a, 34b, 34c, 34d. The remaining portions of the second polysilicon layer 38, i.e., the polysilicon layers 38a, 38b, 38c, 38d, serve as a plurality of minor gate structures including a first minor gate structure 38a, a second minor gate structure 38b, a third minor gate structure 38c, and a fourth minor gate structure 38d.

The first major gate structure 34a and the neighboring first minor gate structure 38a are in conjunction the constituent parts of a first MOSFET-based memory cell, as collectively designated by the reference numeral 200; the second major gate structure 34b and the neighboring second minor gate structure 38b are in conjunction the constituent parts of a second MOSFET-based memory cell, as collectively designated by the reference numeral 202; the third major gate structure 34c and the neighboring third minor gate structure 38c are in conjunction the constituent parts of a third MOSFET-based memory cell, as collectively designated by the reference numeral 204; and the fourth major gate structure 34d and the neighboring fourth minor gate structure 38d are in conjunction the constituent parts of a fourth MOSFET-based memory cell, as collectively designated by the reference numeral 206.

For demonstrative purpose, the first memory cell 200 will be set to a first threshold voltage representing the permanent storage of a first value of the multi-level coded data; the second memory cell 202 will be set to a second threshold voltage representing the permanent storage of a second value of the multi-level coded data; the third memory cell 204 will be set to a third threshold voltage representing the permanent storage of a third value of the multi-level coded data; while the fourth memory cell 206 will be set to a permanently-OFF state representing the permanent storage of a fourth value of the multi-level coded data.

Figure 3G:
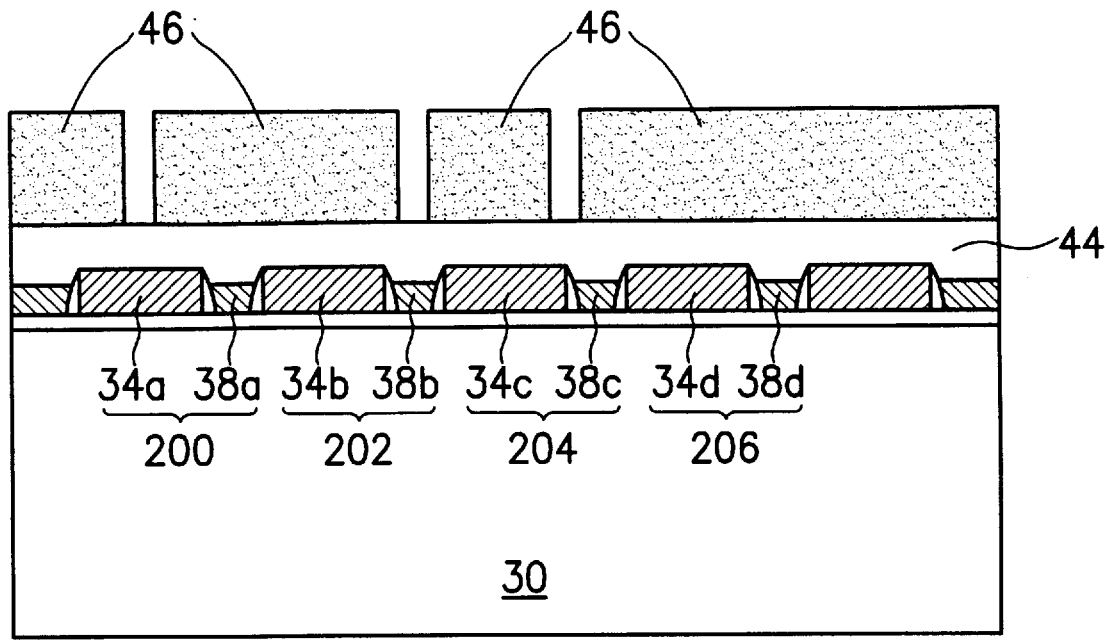

Referring to FIG. 3G, in the subsequent step, a dielectric layer 44, such as an oxide layer, is formed over the entire top surface of the wafer structure of FIG. 3F, covering all of the memory cells 200, 202, 204, 206. Next, a mask-programming process is performed to store multi-level coded data into the ROM device. In the mask-programming process, the first step is to coat a photoresist layer 46 over the dielectric layer 44, and then remove selected portions of the photoresist layer 46 to expose selected surface areas of the dielectric layer 44 in the following manner:

(a) for the first memory cell 200, the surface area of the dielectric layer 44 located directly above the associated major gate structure, i.e., the first major gate structure 34a, is exposed;

(b) for the second memory cell 202, the surface area of the dielectric layer 44 located directly above the associated minor gate structure, i.e., the second minor gate structure 38b, is exposed;

(c) for the third memory cell 204, the surface area of the dielectric layer 44 located directly above the sidewall spacer between the associated major and minor gate structures, i.e., the third major gate structure 34c and the third minor gate structure 38c, is exposed; and (d) for the fourth memory cell 206, no surface area of the dielectric layer 44 located directly above the fourth memory cell 206 is exposed.

Figure 3H:
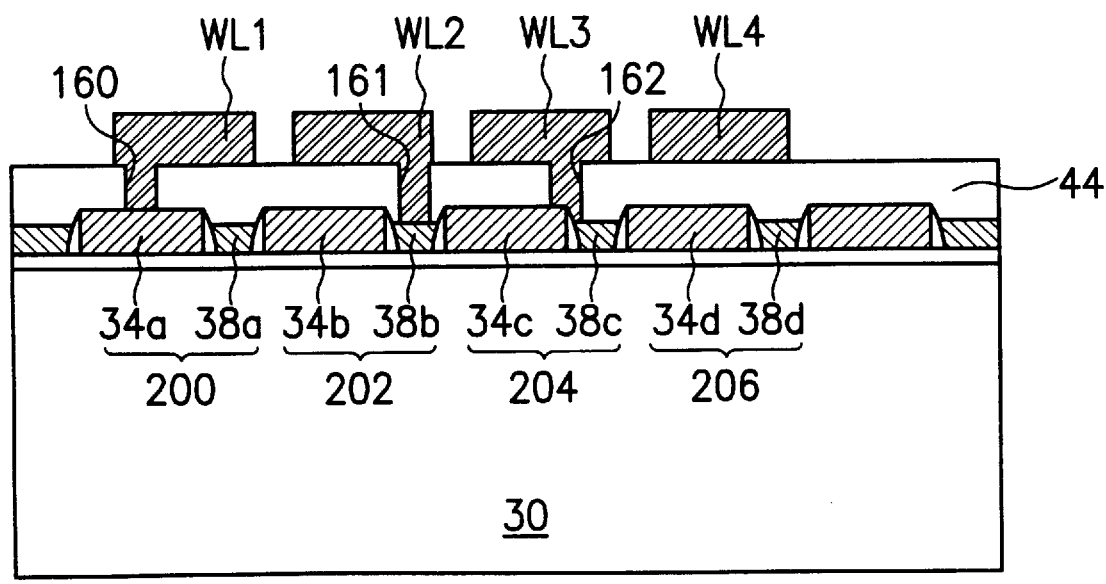

Referring next to FIG. 3H, the exposed portions of the dielectric layer 44 that are uncovered by the photoresist layer 46 are etched away so as to form a first contact window 160, a second contact window 161, and a third contact window 162 in the dielectric layer 44 to expose respectively the first major gate structure 34a associated with the first memory cell 200, the second minor gate structure 38b associated with the second memory cell 202, and the sidewall spacer between the third major gate structure 34c and the third minor gate structure 38c associated with the third memory cell 204. The third contact window 162 also exposes part of the third major gate structure 34c and the third minor gate structure 38c abutting on the exposed sidewall spacer. After this, the photoresist layer 46 is removed.

Subsequently, a conductive layer, such as a layer of a conductive material selected from the group consisting of highly-doped polysilicon, tungsten, titanium, and aluminum, is formed over the dielectric layer 44 and fills up all of the contact windows 160, 161, 162 in the dielectric layer 44. Then, the conductive layer is selectively removed so as to form a plurality of parallel-spaced word lines WL1, WL2, WL3, WL4. Through the contact window 160, 161, 162, the word lines WL1, WL2, WL3, WL4 come into electrical contact with the respective major and minor gate structures associated with the memory cells. This completes the fabrication of the ROM device for permanent storage of four values of the multi-level coded data.

Figure 5:
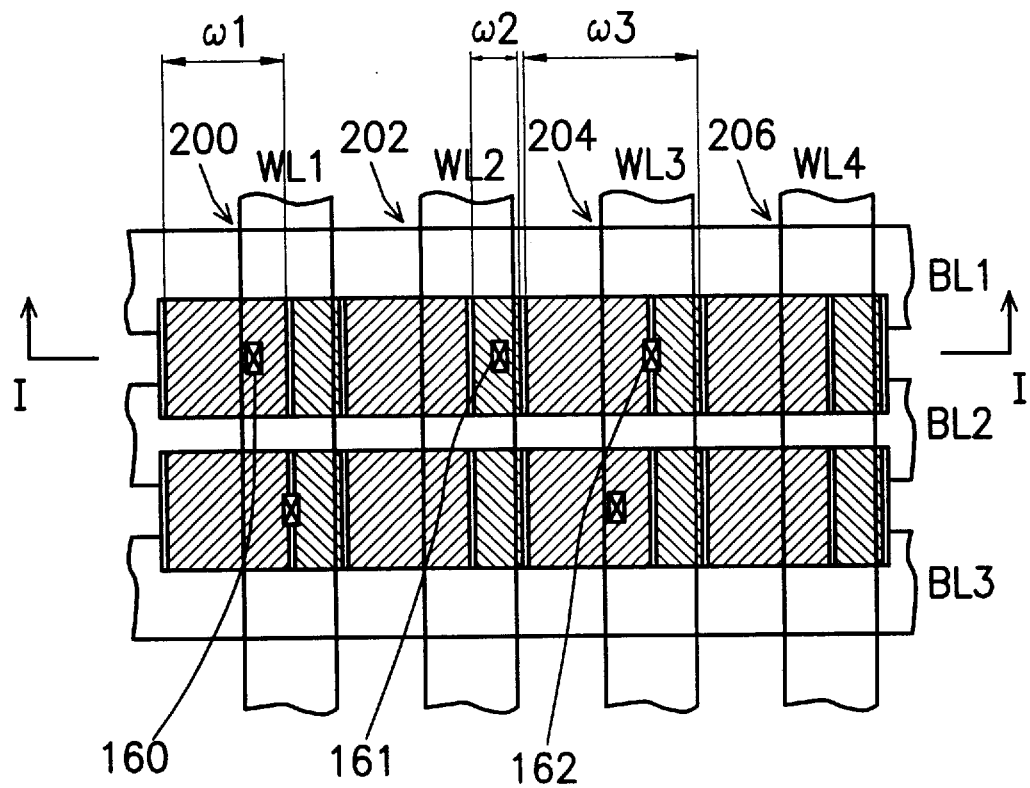
FIG. 5 is a schematic top view of the wafer structure of FIG. 3H.

Referring to FIG. 5, there is shown a schematic top view of the ROM device of the finished product of the ROM device FIG. 3H (the diagram of FIG. 3H is a sectional view cutting through the line I—I in FIG. 5). FIG. 5 shows that the ROM device can be accessed via a plurality of word lines WL1, WL2, WL3, WL4 and bit lines BL1, BL2, BL3.

For the first memory cell 200, the associated word line WL1 is electrically connected via the first contact window 160 to only the first major gate structure 34a thereof, which effectively allows the gate of the first memory cell 200 to have a first width $W_1$ equal to the width of the first major gate structure 34a.

For the second memory cell 202, the associated word line WL2 is electrically connected via the second contact window 161 to only the second minor gate structure 38b thereof, which effectively allows the gate of the second memory cell 202 to have a second width $W_2$ equal to the width of the second minor gate structure 38b.

For the third memory cell 204, the associated word line WL3 is connected via the third contact window 162 to both of the third major gate structure 34c and the neighboring third minor gate structure 38c thereof, which effectively allows the gate of the second memory cell 202 to have a third width $W_3$ substantially equal to the width of the third major gate structure 34c plus that of the third minor gate structure 38c.

For the fourth memory cell 206, since its fourth major gate structure 34d and the fourth minor gate structure 38d are not connected to the associated word line WL4, the fourth memory cell 206 is set to a permanently-OFF state.

Figure 6:
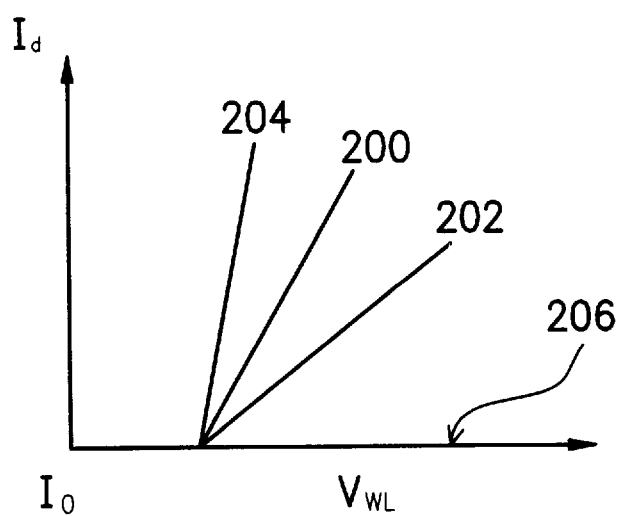
FIG. 6 is a graph, showing the drain current ($I_d$) versus threshold voltage ($V_{WL}$) characteristic of the variously coded memory cells in the ROM device fabricated in accordance with the method of the invention.

Referring to FIG. 6, there is shown a graph plotting the drain current ($I_d$) versus threshold voltage ($V_{WL}$) characteristics respectively for the four memory cells 200, 202, 204, 206 in the ROM device of FIG. 5. Fundamentally, the threshold voltage of the memory cells increases with the width of its gate. It can be seen from the graph of FIG. 6 that, to provide the same level of the drain current, the threshold voltage of the second memory cell 202 is greater than that of the first memory cell 200, and the threshold voltage of the first memory cell 200 is greater than that of the third memory cell 204 since $W_3>W_1>W_2$. The fourth memory cell 206 is set to an permanently-OFF state since its fourth major gate structure 34d and fourth minor gate structure 38d are not connected to the associated word line.

In conclusion, due to the different threshold voltage levels, the four memory cells 200, 202, 204, 206 are set to store different values of the multi-level coded data. The primary advantage of the above-disclosed method is that it requires only one pass of the mask-programming process to finish the coding of the multi-level coded data into the selected memory cells. Compared to the prior art which require the mask-programming process to be performed repeatedly for several passes, the advantage of the invention over the prior art is apparent.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor ROM device for permanent storage of multi-level coded data, comprising:

a semiconductor substrate;

a plurality of substantially parallel-spaced bit lines formed in said substrate;

a plurality of channel regions formed between said bit lines in said substrate;

an array of spaced major gate structures formed above said channel regions;

a plurality of minor gate structures formed between said major gate structures above said channel regions, each of said major gate structures and one neighboring minor gate structures being associated with one memory cell of the ROM device;

a plurality of sidewall spacers for separating said major gate structures from said minor gate structures;

a plurality of word lines connected to the memory cells of the ROM device in such a manner that for a first selected group of the memory cells that are set to a first logic state, the associated word lines are electrically connected to the major gate structures while isolating the minor structures associated with the first selected group of the memory cells;

for a second selected group of the memory cells that are set to a second logic state, the associated word lines are electrically connected to the minor structures while isolating the major gate structure associated with the second selected group of the memory cells;

for a third selected group of the memory cells that are set to a third logic state, the associated word lines are electrically connected to both of the major and minor structures associated with the third selected group of the memory cells; and for a fourth selected group of the memory cells that are set to a fourth logic state, the associated word lines are isolated from the major and minor structures associated the fourth selected group of the memory cells.

* * * * *